United States Patent [19]

Stegmueller

[11] Patent Number: 5,751,219
[45] Date of Patent: May 12, 1998

[54] TESTING INSTRUMENT WITH A DISPLAY ELEMENT

[75] Inventor: Karl Stegmueller, Wiesent, Germany

[73] Assignee: AEG Sachsenwerk GmbH, Germany

[21] Appl. No.: 725,545

[22] Filed: Oct. 3, 1996

[30] Foreign Application Priority Data

Oct. 21, 1995 [DE] Germany ............... 195 39 227.2

[51] Int. Cl.⁶ ................................................ G08B 5/00
[52] U.S. Cl. ........................ 340/815.4; 340/815.44; 340/660; 340/663; 340/691; 324/555; 324/556; 73/866.3; 73/865.9
[58] Field of Search ................................ 340/660, 663, 340/691, 815.4, 815.44; 324/555, 556; 73/866.3, 865.9; 345/35–40, 43

[56] References Cited

U.S. PATENT DOCUMENTS 3,573,791  4/1971  Hesse ............................ 345/34
3,999,180  12/1976  Hickman ..................... 340/815.4

FOREIGN PATENT DOCUMENTS

| | | |
|---|---|---|
| 3219703A1 | 12/1983 | Germany. |
| 2854415C3 | 4/1989 | Germany. |
| 3727950C2 | 7/1989 | Germany. |
| 9406553 U | 8/1994 | Germany. |
| 4318288A1 | 12/1994 | Germany. |
| 4323731A1 | 12/1994 | Germany. |
| 9411084 U | 3/1995 | Germany. |
| WO82/03489 | 10/1982 | WIPO. |

OTHER PUBLICATIONS

Patent Abstracts of Japan, P–1482, Feb. 5, 1993, vol. 17; No. 60; JP 4–269786.

*Primary Examiner*—Jeffery Hofsass
*Assistant Examiner*—Julie B. Lieu
*Attorney, Agent, or Firm*—Spencer & Frank

[57] ABSTRACT

A testing instrument including a display element and two control paths that are separately activated. The display element has a display field shaped like a lightning bolt or zigzag and has at least three partial display fields which follow successively in a longitudinal direction of the display element. Each of adjoining partial display fields is connected to a different one of the two control paths.

3 Claims, 1 Drawing Sheet

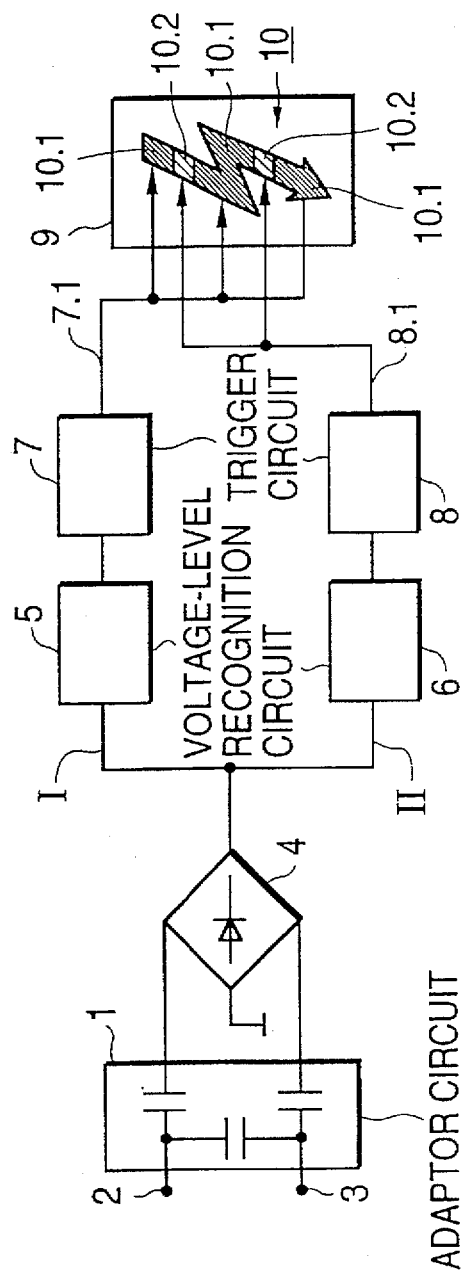

5,751,219

TESTING INSTRUMENT WITH A DISPLAY ELEMENT

CROSS-REFERENCE TO RELATED APPLICATIONS

This application is related to application No. 195 39 227.2 filed in Germany on Oct. 21, 1995, the disclosure of which is incorporated herein by reference.

BACKGROUND OF THE INVENTION

The invention relates to a testing instrument which includes a display element having a display field shaped like a lightning bolt or zigzag comprised of partial display fields.

A known testing instrument of this type is disclosed in German patent publication 43 23 731 wherein the testing instrument is used to display the existence or lack of a voltage in high or medium voltage plants. The instrument has a coupling section that is connected capacitively via a coupling electrode to a structural component with high voltage and is designed to feed a display element. In order to test the functional capability of the coupling segment, the testing instrument has an additional measuring path, which generates an additional control signal for a predetermined minimum test value. This control signal generates an error signal in the multi-field display element. The display element has a zigzag shape, like a lightning bolt, to indicate high voltage. In one leg segment of the display element, there is a separately controllable partial display field that is shaped like a tool. This embodiment of the display element has the disadvantage that for a small display field design, the partial display field, which serves to indicate danger, cannot be clearly seen.

SUMMARY OF THE INVENTION

It is an object of the invention to provide a measure for a testing instrument of the type first mentioned above by which the individual partial display fields will be clearly defined.

The above and other objects are accomplished according to the invention by the provision of a testing instrument including a display element and two control paths that are separately activated, wherein the display element has a display field shaped like a lightning bolt or zigzag and has at least three partial display fields which follow successively in a longitudinal direction of the display element, with each of adjoining partial display fields being connected to a different one of the two control paths.

According to one embodiment of the testing instrument of the invention, the display field is composed of at least three successive partial display fields, wherein the individual successive partial display fields are connected at least alternately to different control lines, so that the total display field is divided optically in case of a control signal failure. This indicates to the user of a testing instrument that an error condition exists at the testing instrument or the connected coupling with the high voltage-conducting structural component that is to be tested. In particular, the display field for the display element is formed by an LCD element. Owing to its low control power requirement, the display element can be fed without an external voltage source, directly from the capacitive coupling device, following a respective conversion.

The invention is explained below in greater detail in conjunction with the accompanying drawing which shows an exemplary embodiment.

BRIEF DESCRIPTION OF THE DRAWINGS

FIG. 1 shows a circuit schematic for a display arrangement according to the invention.

DESCRIPTION OF THE PREFERRED EMBODIMENTS

Referring to FIG. 1, there is shown a testing instrument for determining the existence or lack of a voltage, particularly in medium voltage switchgear assemblies, in accordance with the invention. The testing instrument is connected to a non-depicted regulation coupling segment, which is coupled capacitively with a structural component under voltage, based on predetermined criteria. The electrical power, which is coupled out via the coupling segment, is fed to inputs 2 and 3 of an adapter 1, wherein the adapter is designed as a capacitive impedance matching transformer segment. A rectifying arrangement 4, which is preferably in the form of a bridge circuit, is connected to the output of adapter 1. A direct current outlet of rectifier arrangement 4 feeds two electrically parallel-connected measuring paths I and II which feed respective input side modules designed as voltage-level recognition circuits 5 and 6, which are laid out in particular in the manner of threshold value switches or Schmidt triggers and, depending on the input level, generate either a turn-on signal or a turn-off signal. Trigger circuits 7, 8 are connected, respectively, in series after the voltage-level recognition circuits 5, 6 and function to trigger display field groups in a multi-field LCD display element 9.

The switching levels for the voltage-level recognition circuits are designed so that for a voltage level that still permits the conclusion of a regular function, measuring path I generates a turn-on signal, while measuring path II also generates a turn-on signal at a voltage level that is higher by one safety factor. If the minimum voltage level predetermined for the second measuring path II exists, then both measuring paths generate a turn-on signal. If the voltage falls below the minimum voltage level predetermined for measuring path II, then measuring path II does not generate an output signal. However, an output signal is present at measuring path I if the voltage does not fall below its lowest trigger voltage level.

The display element 9 has a total display field 10 that is shaped like a lightning bolt or zigzag. The field is composed of partial display fields 10.1 and 10.2, which can be triggered separately and which follow successively in a longitudinal direction of the display element. Thus, fields 10.1 are respectively separated from each other completely by fields 10.2. The same is true for fields 10.2, which are separated from each other by one field 10.1. Partial display fields 10.1 are connected in parallel to the output line 7.1 of trigger circuit 7 of first measuring path I. Partial display fields 10.2 are connected in parallel to the output line 8.1 of trigger circuit 8 of measuring path II.

If the coupling circuit, which is not shown, delivers a signal at a level where it is coupled out from the high-voltage line during normal operation of the coupling segment, then both voltage-level recognition circuits 5, 6 generate an output signal, so that the partial display fields 10.1 and 10.2 are activated by the coordinated trigger circuits 7, 8 on the respective output lines 7.1 and 8.1. The total display field is the activated as a uniform display area. If, on the other hand, the voltage level that is coupled out by the coupling segment falls below the threshold voltage for the voltage-level recognition circuit 6 for measuring path II, but not the threshold voltage for the voltage-level recognition circuit 5 of measuring path I, then the partial display fields 10.2 are no longer activated, so that only the partial display fields 10.1 are triggered and generate an error signal, presenting an interrupted display field 10. In that case, it must be concluded that the coupling element has failed. However, this preserves the reference indicating that the high-voltage structural component to be monitored is still under high voltage. In case of a failure, the interruption of the zig-zag-shaped display field by dividing the total display field in the longitudinal direction into several partial display fields results in a clear error signal in that only every second partial display field is activated. The partial display fields 10.1 or 10.2 distinguish themselves from the appearance of the surrounding area of display element 9, at least in the active condition.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A testing instrument including a display element and two control paths that are separately activated and connected to the display element, each control path including a voltage-level recognition circuit and a trigger circuit connected in series, wherein the voltage-level recognition circuits have different minimum threshold voltages which, if exceed, result in an output signal being fed to the respective trigger circuit, the display element has a display field which includes at least three partial display fields which follow successively in a longitudinal direction of the display element, the partial display fields comprise a first group of non-contiguous partial display fields and a second group of non-contiguous partial display fields, and each trigger circuit has an output connected to a respective one of the groups of partial display fields.

2. The testing instrument according to claim 1, wherein the display element comprises an LCD element.

3. The testing instrument of claim 1, wherein the display field has a shape of a zigzag.

* * * * *